(12) United States Patent
Ting et al.

(10) Patent No.: US 8,686,527 B2
(45) Date of Patent: Apr. 1, 2014

(54) POROUS SI AS CMOS IMAGE SENSOR ARC LAYER

(75) Inventors: Shyh-Fann Ting, Kaohsiung (TW);
Yen-Ting Chiang, Tainan (TW);
Ching-Chun Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 16 days.

(21) Appl. No.: 13/556,932

(22) Filed: Jul. 24, 2012

(65) Prior Publication Data
US 2013/0341746 A1    Dec. 26, 2013

Related U.S. Application Data

(60) Provisional application No. 61/663,392, filed on Jun. 22, 2012.

(51) Int. Cl.
*H01L 31/0232* (2006.01)

(52) U.S. Cl.
USPC ............................. 257/437; 257/59; 257/432

(58) Field of Classification Search
USPC ................................ 257/59, 77, 432, E31.127
See application file for complete search history.

(56) References Cited

U.S. PATENT DOCUMENTS

| | | | | |
|---|---|---|---|---|
| 5,970,360 A | * | 10/1999 | Cheng et al. | 438/398 |
| 2008/0193635 A1 | * | 8/2008 | Aroutiounian et al. | 427/74 |
| 2010/0227432 A1 | * | 9/2010 | Kashkoush | 438/97 |
| 2011/0316002 A1 | * | 12/2011 | Ahn et al. | 257/77 |
| 2013/0126903 A1 | * | 5/2013 | Sung | 257/77 |

* cited by examiner

*Primary Examiner* — Phuc Dang
(74) *Attorney, Agent, or Firm* — Slater & Matsil, L.L.P.

(57) ABSTRACT

A semiconductor device is provided. The semiconductor device includes metallization layers supported by a substrate, a diode and a partially doped silicon layer disposed over the metallization layers, a buffer layer disposed over the diode and the partially doped silicon layer; and an anti-reflective coating disposed over the buffer layer, the anti-reflective coating formed from a porous silicon.

18 Claims, 6 Drawing Sheets

POROUS SI AS CMOS IMAGE SENSOR ARC LAYER

CROSS-REFERENCE TO RELATED APPLICATIONS

This application claims the benefit of U.S. Provisional Application No. 61/663,392, filed on Jun. 22, 2012, entitled "POROUS SI AS CMOS IMAGE SENSOR ARC LAYER," which application is hereby incorporated herein by reference.

BACKGROUND

A complementary metal oxide semiconductor image sensor generally utilizes a series of photodiodes formed within an array of pixel regions of a semiconductor substrate in order to sense when light has impacted the photodiode. Adjacent to each of the photodiodes within each of the pixel regions, a transfer transistor may be formed in order to transfer the signal generated by the sensed light within the photodiode at a desired time. Such photodiodes and transfer transistors allow for an image to be captured at a desired time by operating the transfer transistor at the desired time.

The complementary metal oxide semiconductor image sensor may be formed in either a front side illumination (FSI) configuration or a back-side illumination (BSI) configuration. In a front-side illumination configuration, light passes to the photodiode from the "front" side of the image sensor where the transfer transistor has been formed. However, forcing the light to pass through any overlying metal layers, dielectric layers, and past the transfer transistor before it reaches the photodiode may generate processing and/or operational issues as the metal layers, dielectric layers, and the transfer transistor may not necessarily be translucent and easily allow the light to pass through.

In the BSI configuration, the transfer transistor, the metal layers, and the dielectric layers are formed on the front side of the substrate and light is allowed to pass to the photodiode from the "back" side of the substrate. As such, the light hits the photodiode before reaching the transfer transistor, the dielectric layers, or the metal layers. Such a configuration may reduce the complexity of the manufacturing of the image sensor and improve the image sensor operation.

The conventional BSI device may employ an anti-reflective coating (ARC) layer in order to reduce the reflection of light. The ARC layer in the conventional BSI device may be formed from, for example, silicon carbide (SiC), silicon nitride (SiN), or a high-k dielectric film.

Conventional image sensors may also include a transparent electrode. The transparent electrode may be formed from, for example, indium tin oxide (ITO) or indium zinc oxide (IZO).

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a backside illumination (BSI) semiconductor device. The concepts in the disclosure may also apply, however, to a front side illumination (FSI) configuration or other semiconductor structures or circuits.

Figure 1:
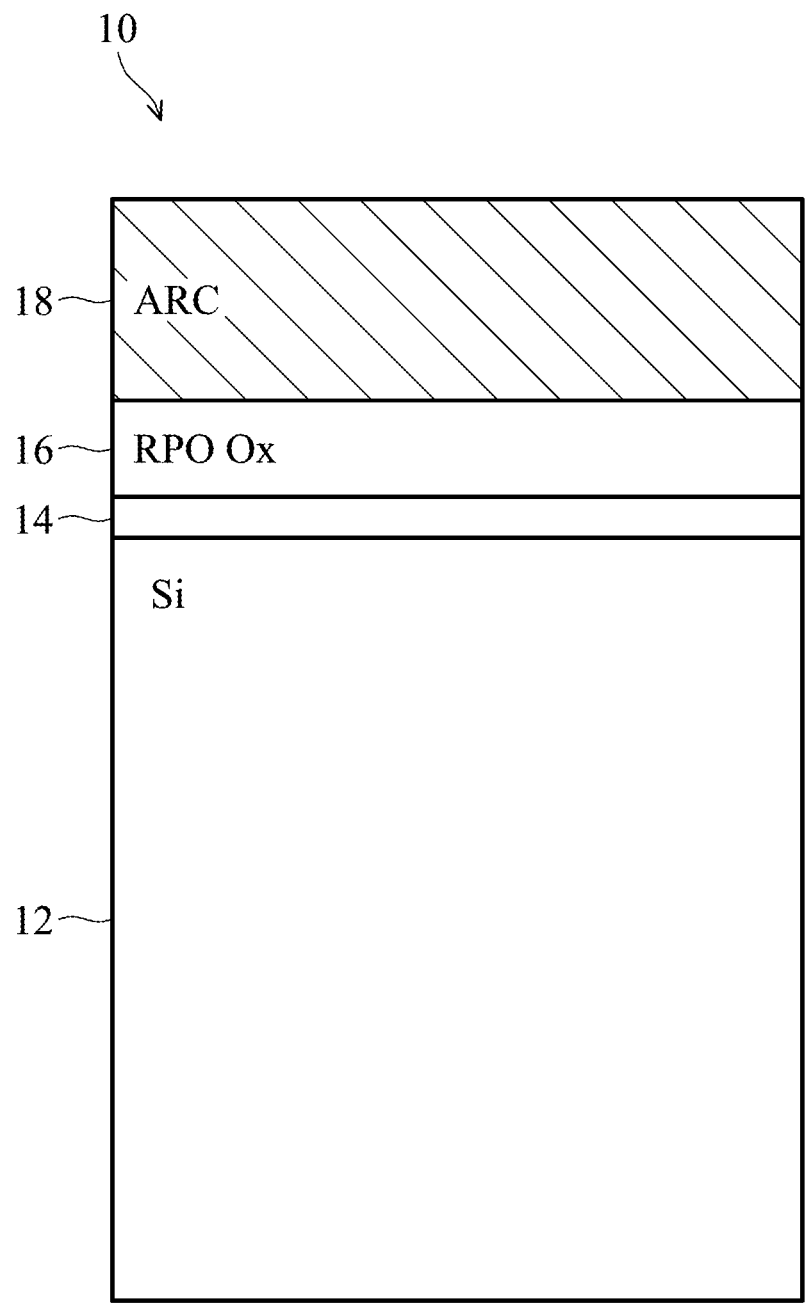
FIG. 1 is a cross section of a representative portion of a prior art BSI device.

Referring to FIG. 1, a cross section of a representative portion of a conventional back-side illumination (BSI) device 10 is illustrated. As shown in FIG. 1, the representative portion of the conventional BSI device 10 includes a silicon substrate 12 supporting a high-quality thin oxide layer 14. A remote plasma oxide layer (RPO Ox) 16 is disposed over the thin oxide layer 14 and an anti-refractive coating (ARC) 18 (a.k.a., anti-reflective coating) is disposed over the remote plasma oxide layer 16. The ARC 18 in the conventional BSI device 10 is typically silicon carbide (SiC), silicon nitride (SiN), or high-k dielectric film.

Figure 2:
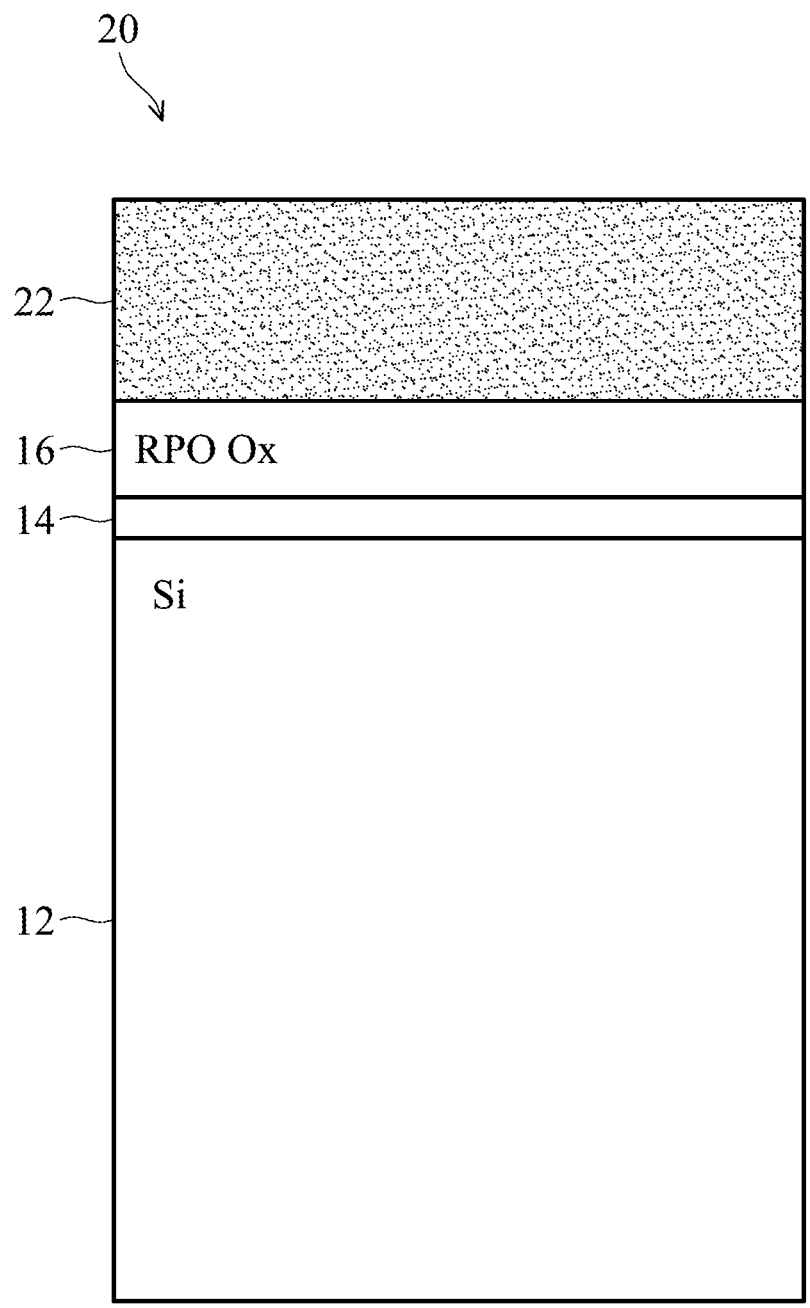
FIG. 2 is a cross section of a representative portion of an embodiment BSI device using a porous silicon (Si)

Referring now to FIG. 2, a cross section of a representative portion of an embodiment back-side illumination (BSI) device 20 is illustrated. As shown in FIG. 2, the silicon carbide (SiC), silicon nitride (SiN), or high-k dielectric film used to form the ARC 18 in the conventional BSI device 10 of FIG. 1 has been replaced by a porous silicon (Si) 22. In other words, the ARC 18 in the BSI device 20 is formed from porous Si 22. As will be more fully explained below, use of the porous Si 22 as the ARC provides embodiment BSI devices with an ultra-low reflectivity and a lower absorption coefficient, which results in a higher light transmission.

Porous silicon (p-Si) is a form of the chemical element silicon which has introduced nanoporous holes in its microstructure. Porous silicon offers several qualities, including permitting light emission in silicon and offering a large surface to volume ratio. Porous silicon is generally formed using an electrochemical etch process. For example, porous silicon may be produced by etching crystalline silicon in aqueous or non-aqueous electrolytes containing hydrofluoric acid (HF).

Figure 3:
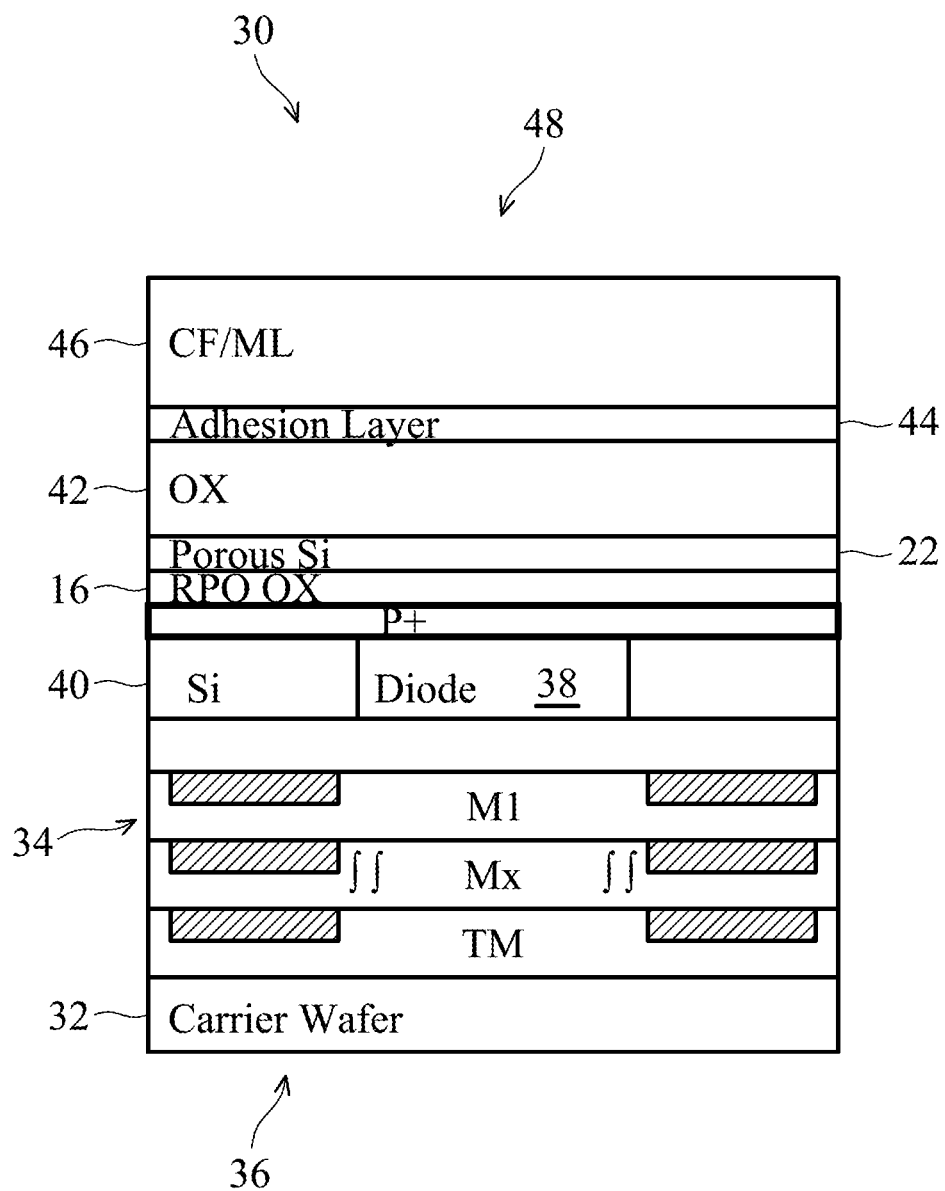
FIG. 3 is a cross section of an embodiment BSI device with additional detail.

Referring now to FIG. 3, a cross section of an embodiment BSI device 30 with additional detail is provided. As shown, the BSI device 30 includes a carrier wafer 32 supporting several metallization layers 34 (M1, Mx, TM). For the purpose of orientation, the carrier wafer 32 is disposed at a front side 36 of the BSI device 30. Still referring to FIG. 3, a diode 38 is disposed above the metallization layers 34. The diode 38 is generally embedded in, or encapsulated by, a layer of p-doped silicon 40. In an embodiment, an upper layer of the silicon 40 is highly p-doped (p+).

In FIG. 3, for ease of illustration both the remote plasma oxide layer 16 and the high-quality thin oxide layer 14 (FIG. 2) are depicted as a single layer labeled RPO OX 16. The remote plasma oxide layer 16 and/or the high-quality thin oxide layer 14 may be collectively referred to herein as a buffer layer. In an embodiment, instead of being formed from an oxide or several layers of oxide, the buffer layer may also be formed from another suitable dielectric material such as, for example, silicon nitride (SiN), silicon carbide (SiC), silicon carbon nitride (SiCN), hafnium oxide (HfO$_2$), titanium dioxide (TiO$_2$), aluminum oxide (Al$_2$O$_3$), a high-k dielectric film, and so on.

Figure 6:
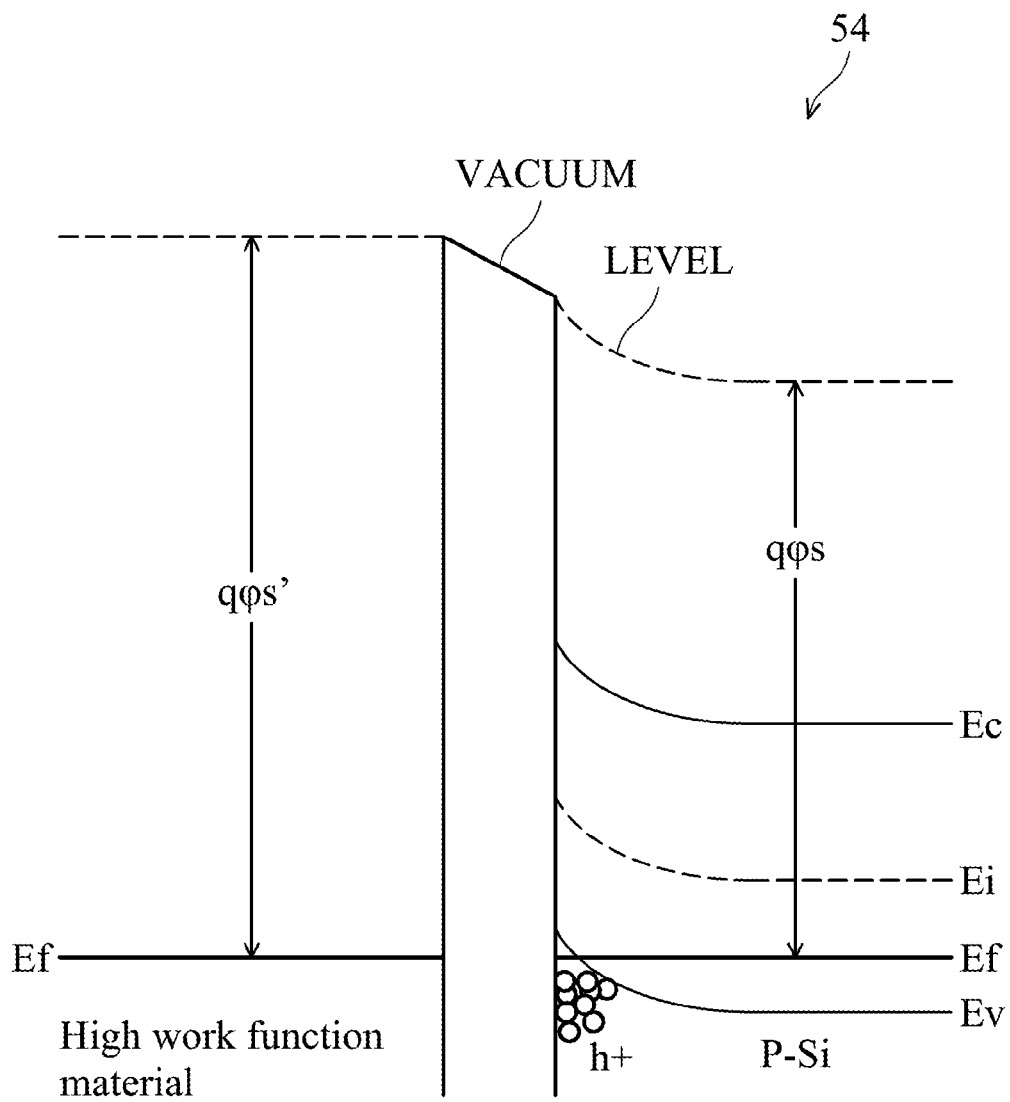
FIG. 6 is a band diagram illustrating how doping may be used to modulate a surface condition of the silicon in the BSI device of FIG. 3.

As shown in FIG. 3, the porous Si 22 is disposed over the remote plasma oxide layer 16. The porous Si 22 may be formed with a wide range of porosity percentages. Indeed, in an embodiment the porosity percentage of the porous Si 22 is between about zero percent (i.e., a polysilicon) and about eighty percent. In an embodiment, the porous Si 22 is highly doped. In an embodiment, the porous Si 22 is doped with p-type impurities. In an embodiment, the porous Si 22 functions or acts similarly to an anti-reflective coating layer. As such, the porous Si 22 may be referred to herein as an anti-reflective coating or ARC. In an embodiment, the porous Si 22 is so heavily doped that it has the characteristics of, or similar to, a metal. With regard to the porous Si 22, porosity refers to the void to Si ratio in the porous Si 22. The refractive index, n, and the absorption coefficient, k, values of the porous Si 22 (i.e., the ARC film) are a function of porosity. The in-situ doping process for the porous Si 22 may change the charge distribution in the silicon 40 (FIG. 6).

Still referring to FIG. 3, a passivating oxide layer 42 is formed over the porous Si 22. Next, an adhesion layer 44 may be formed over the passivating oxide 42. Thereafter, additional materials such as, for example, a color filter (CF) and a microlens (ML) 46 may be added to the BSI device 30. For the purpose of orientation, the color filter and microlens 46 are disposed at a back side 48 of the BSI device 30.

Figure 4:
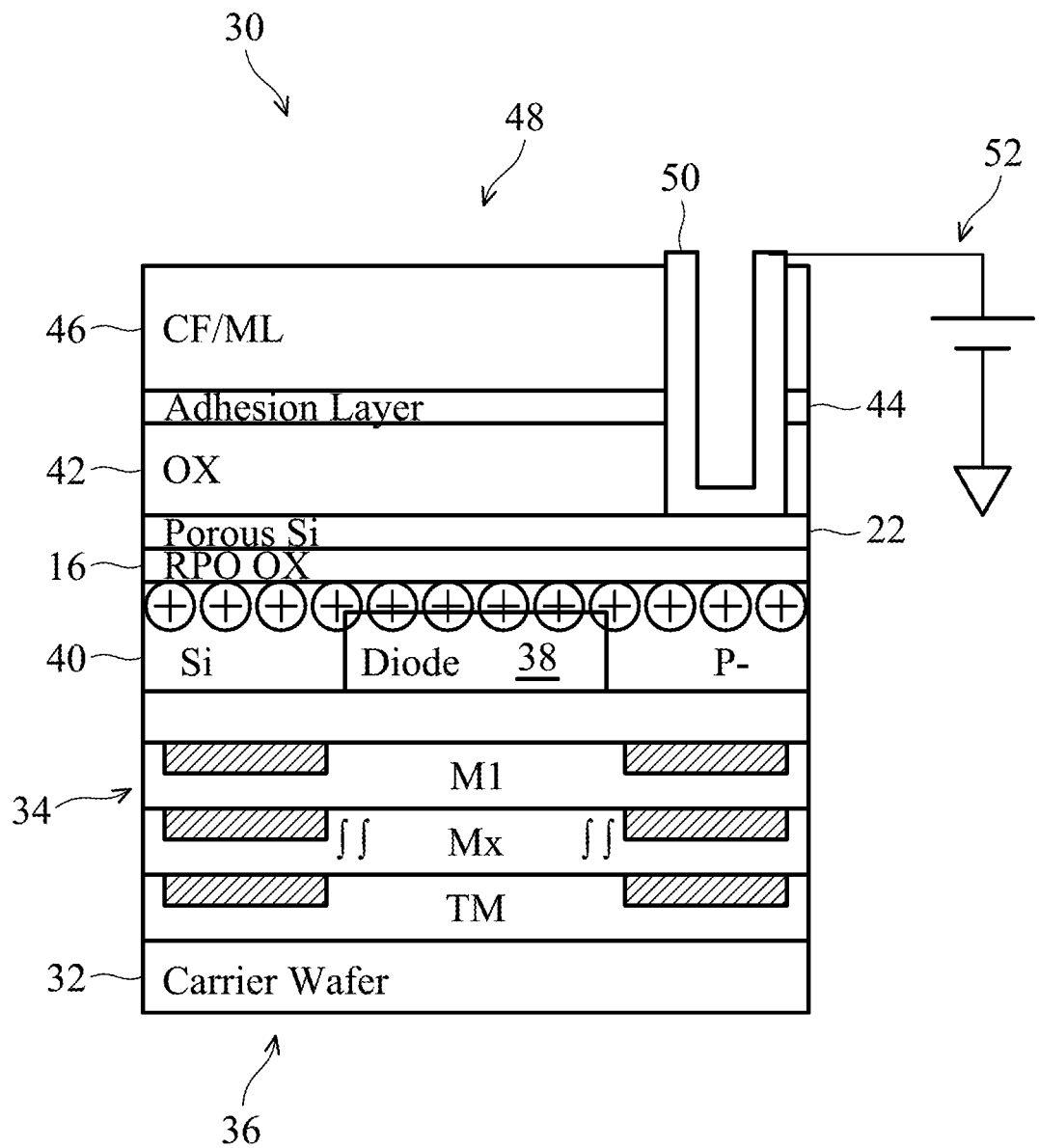
FIG. 4 is a cross section of the BSI device of FIG. 3 with a metal contact.

Referring now to FIG. 4, the BSI device 30 is illustrated. As shown in FIG. 4, a metal contact (PAD) 50 has been formed into the BSI device 30 down to the porous Si 22. As such, the metal contact 50 and the porous Si 22 are electrically coupled. When the porous Si 22 is connected with the metal contact 50 under a negative bias 52, holes will accumulate at or near a surface of the silicon 40. In contrast, if the porous Si 22 is connected under a positive bias, electrons will accumulate.

Notably, where the conventional BSI device 10 (FIG. 1) employs silicon carbide (SiC), silicon nitride (SiN), or a high-k dielectric film as the anti-refraction coating 18 instead of porous Si 22, the anti-refractive coating 18 cannot be connected to a metal contact (e.g., metal contact 50) under a negative bias as shown in FIG. 4.

Figure 5:
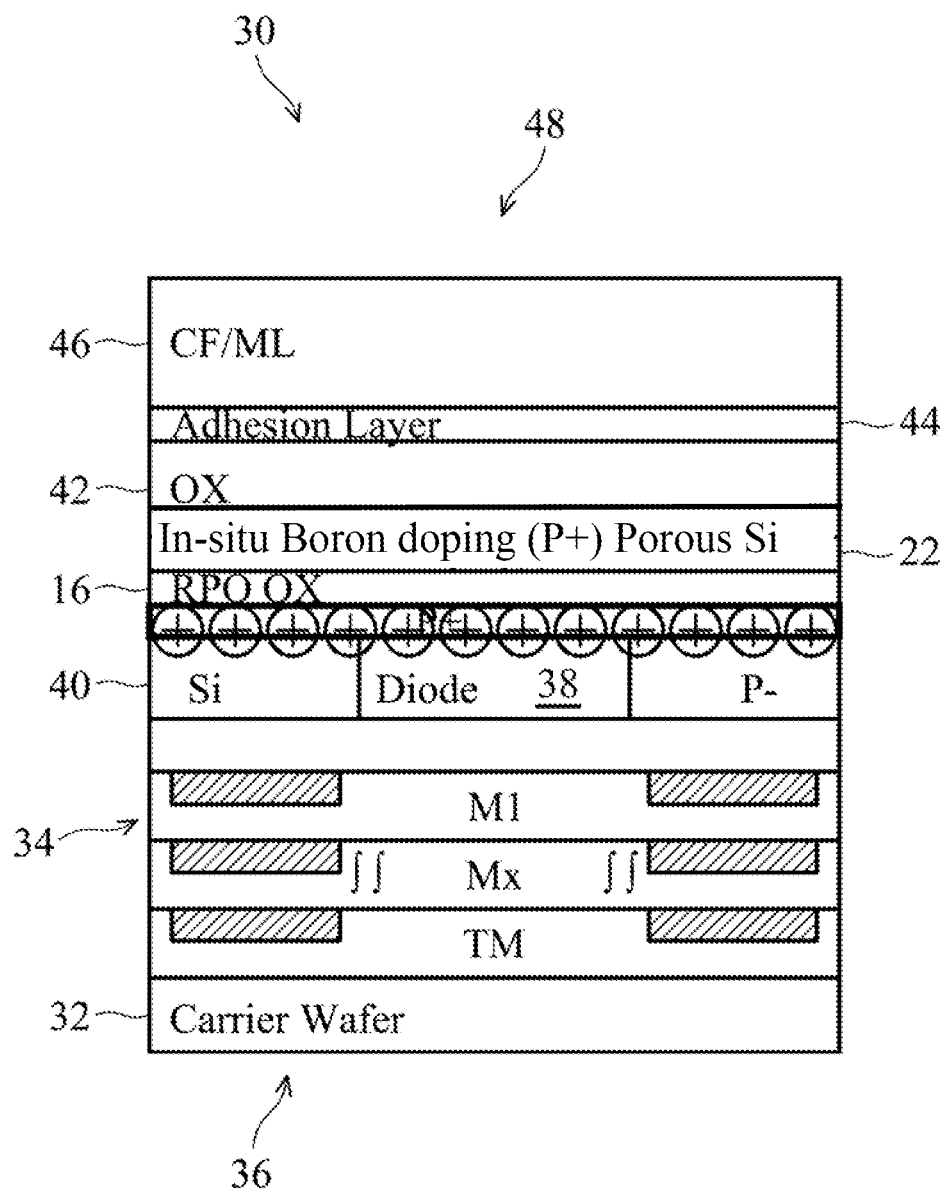
FIG. 5 is a cross section of the BSI device of FIG. 3 where the porous silicon is formed by in-situ doping.

Referring now to FIG. 5, the porous Si 22 of the BSI device 30 has been formed using an in-situ Boron doping process. In an embodiment, the porous Si 22 is highly doped with p-type impurities. Even so, the porous Si 22 may also be formed using an n-type in-situ doping process or type. In addition, in an embodiment the in-situ doping dose may be between about zero ions/cm$^2$ to about $5\times10^{21}$ ions/cm$^2$. In an embodiment, when the porous Si 22 is used as an anti-refraction layer, the embodiment BSI device 30 has a low reflectivity of about one percent (1%). FIGS. 4-5 illustrate potential methods that may be used to improve CIS dark current (DC) and white pixel (WP) performance. The methods of FIGS. 4-5 may be employed separately or used in combination in order to charge silicon 40.

Referring now to FIG. 6, a band diagram 54 illustrates how doping may be used to modulate the surface condition of the silicon 40 (FIGS. 3-5). For example, if the porous Si 22, which is the high work function material, is doped with p-type impurities, holes will be induced at or near the silicon 40. In contrast, if the porous Si 22 is doped with n-type impurities, electrons will be induced.

By way of example, in FIG. 6 the left side of the diagram represents the porous Si 22. A central portion of the diagram 54 represents the remote plasma oxide 16 and/or the thin oxide 14. The right side of the diagram 54 represents the substrate 40. An intrinsic band (Ei) is disposed between a conduction band ($E_c$) and a valence band ($E_b$), and the Fermi level ($E_f$) on either side of the remote plasma oxide 16 will equalize. If the curve of the conduction band ($E_c$) and the valence band ($E_b$) go up as in FIG. 6, holes will accumulate. In contrast, if the curve of the conduction band and the valence band go down, electrons will accumulate. With reference to FIG. 6 and by way of example, where the silicon 40 is p-doped and the porous Si 22 is heavily p-doped, holes will be formed proximate the silicon 40 surface. The holes are represented by the h+.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A semiconductor device, comprising:
   metallization layers supported by a substrate;
   a diode and a partially doped silicon layer disposed over the metallization layers;
   a buffer layer disposed over the diode and the partially doped silicon layer;
   an anti-reflective coating disposed over the buffer layer, the anti-reflective coating formed from a porous silicon, and
   wherein the porous silicon is electrically coupled to a metal pad.

2. The semiconductor device of claim 1, wherein the buffer layer is formed from one of an oxide, several discrete layers of oxide, silicon nitride (SiN), silicon carbide (SiC), and a high-k dielectric film.

3. The semiconductor device of claim 1, wherein a porosity of the porous silicon is in a range of about zero percent to about eighty percent.

4. The semiconductor device of claim 1, wherein the porous silicon is electrically coupled to a metal pad under a negative bias.

5. The semiconductor device of claim 1, wherein the porous silicon is electrically coupled to a metal pad under a positive bias.

6. The semiconductor device of claim 1, wherein the porous silicon has been formed through an in-situ doping process.

7. The semiconductor device of claim 1, wherein the porous silicon has been formed through an n-type in-situ doping process.

8. The semiconductor device of claim 1, wherein the porous silicon has been formed through a p-type in-situ doping process.

9. The semiconductor device of claim 1, wherein the porous silicon has been formed through an in-situ doping process with a doping dose between about zero ions/cm$^2$ to about $5\times10^{21}$ ions/cm$^2$.

10. The semiconductor device of claim 1, wherein the metallization layers are oriented in a back side illumination configuration.

11. The semiconductor device of claim 1, wherein the metallization layers are oriented in a front side illumination configuration.

12. A semiconductor device, comprising:
   metallization layers supported by a substrate;
   a diode and a partially doped silicon layer disposed over the metallization layers;
   a buffer layer disposed over the diode and the partially doped silicon layer, the buffer layer formed from a first oxide layer formed over a second oxide layer;
   an anti-reflective coating disposed over the buffer layer, the anti-reflective coating formed from a porous silicon; and
   a metal pad electrically coupled to the porous silicon.

13. The semiconductor device of claim 12, wherein a porosity of the porous silicon is in a range of about zero percent to about eighty percent.

14. The semiconductor device of claim 12, wherein the porous silicon has been formed through one of an n-type in-situ doping process and a p-type in-situ doping process.

15. The semiconductor device of claim 12, wherein the metallization layers are oriented in a back side illumination configuration.

16. The semiconductor device of claim 12, wherein the first oxide layer is a remote plasma oxide and the second oxide layer is a high-quality thin oxide layer.

17. A method of forming a semiconductor device, comprising:
   forming metallization layers over a substrate;
   forming a diode and a partially doped silicon layer over the metallization layers;
   forming a buffer layer over the diode and the partially doped silicon layer;
   forming an anti-reflective coating composed of a porous silicon over the buffer layer, and
   further comprising electrically coupling the porous silicon to a metal pad.

18. The method of claim 17, further comprising forming the anti-reflective coating composed of the porous silicon using an in-situ doping process.

* * * * *